United States Patent [19]
Ookubo

[11] Patent Number: 4,782,311
[45] Date of Patent: Nov. 1, 1988

[54] THREE TERMINAL FILTER

[75] Inventor: Akira Ookubo, Nagaokakyo, Japan

[73] Assignee: Murata Manufacturing Co., Ltd., Japan

[21] Appl. No.: 54,759

[22] Filed: May 27, 1987

[30] Foreign Application Priority Data
Jun. 3, 1986 [JP] Japan ............................ 61-85191[U]

[51] Int. Cl.⁴ .............................................. H03H 7/01
[52] U.S. Cl. ..................................... 333/167; 333/12; 333/184; 333/185
[58] Field of Search ................. 333/167, 12, 181–185, 333/175–177

[56] References Cited
U.S. PATENT DOCUMENTS

| | | | |
|---|---|---|---|
| 4,320,364 | 3/1982 | Sakamoto et al. | 333/167 |
| 4,563,659 | 1/1986 | Sakamoto | 333/181 |
| 4,571,561 | 2/1986 | Fujiki et al. | 333/167 X |

Primary Examiner—Marvin L. Nussbaum
Attorney, Agent, or Firm—Ostrolenk, Faber, Gerb & Soffen

[57] ABSTRACT

A three terminal filter according to the present invention has a hot lead terminal provided with substantially U-shaped holding portions and a plate capacitor arranged between a pair of magnetic cores.

14 Claims, 2 Drawing Sheets

THREE TERMINAL FILTER

BACKGROUND OF THE INVENTION

1. Field of the Invention

The present invention relates to a three terminal capacitor, and more particularly, it relates to a three terminal filter which is suitably applied to a noise filter.

2. Description of the Prior Art

FIG. 9 schematically shows a conventional three terminal capacitor which is disclosed in, e.g., U.S. Pat. No. 4,320,364. Referring to FIG. 9, capacitor electrodes 2 and 3 are provided on front and rear surfaces of a discoidal dielectric substrate 1. A substantially U-shaped hot lead terminal 4 and a ground lead terminal 5 are connected/fixed to each of the electrodes 2 and 3 by solder or the like. Both leg portions 6 and 7 of the hot lead terminal 4 pass through ferrite beads 8 and 9, which are fixed to the leg portions 6 and 7 by an adhesive agent or the like. An armoring member 10 of insulating resin or the like is provided to cover the periphery of the dielectric substrate 1, if necessary.

The conventional three terminal capacitor of the aforementioned structure forms an equivalent circuit as shown in FIG. 3. This capacitor is used as shown in FIG. 10, for example. Referring to FIG. 10, a printed circuit board 14, which is formed on its rear side with a pair of input/output patterns 11 and 12 and a ground pattern 13, is provided with holes (not shown) passing through the respective patterns 11, 12 and 13 from the front side of the printed circuit board 14. These holes are adapted to receive both the leg portions 6 and 7 of the aforementioned hot lead terminal 4 and the ground lead terminal 5. Thus, both the leg portions 6 and 7 of the hot lead terminal 4 and the ground lead terminal 5 are connected/fixed to the respective patterns 11, 12 and 13 by solder or the like.

In such a conventional three terminal capacitor, however, the leg portions 6 and 7 of the hot lead terminal 4 pass through the ferrite beads 8 and 9 below the dielectric substrate 1, whereby the height of the product is increased, leading to an increase in overall size. Further, since the dielectric substrate 1 must be held between the hot lead terminal 4 and the ground lead terminal 5, positioning of the dielectric substrate 1 is difficult. The dielectric substrate 1 may easily be moved during a holding step before soldering of the terminals 4 and 5 to the respective electrodes 2 and 3 of the dielectric substrate 1, whereby the unstable product quality is obtained and reliability is reduced. Further, the ferrite beads 8 and 9, having inner diameters larger than the diameters of the leg portions 6 and 7, are mounted on the leg portions 6 and 7 to be fixed to the same by an adhesive agent or the like, whereby positioning of the ferrite beads 8 and 9 with respect to the leg portions 6 and 7 is difficult. Thus, the ferrite beads 8 and 9 may be irregularly mounted as shown in FIG. 11 for example, whereby the thickness of the product is increased to a level $h_1$ at the maximum to cause an increase in overall size, while leading to irregular product quality to again reduce reliability. Further, when the capacitor is mounted on the printed circuit board 14 as shown in FIG. 10, the ground lead terminal 5 is increased in length, to generate unwanted inductance in the lengthened portion. Thus, the filter characteristics are deteriorated when the product is applied to use in a noise filter.

SUMMARY OF THE INVENTION

An object of the present invention is to provide a small-sized three terminal filter comprising a three terminal capacitor of high reliability, which has excellent filter characteristics.

The three terminal filter according to the present invention has the following structure: A hot lead terminal has first and second holding portions. The first and second holding portions are substantially U-shaped parts which are continuous with each other, being connected by a connecting portion and held parallel to each other with a space between them, each having a pair of substantially parallel outer and inner leg portions. Respective outer leg portions of both the holding portions pass through magnetic cores, which are held between the pairs of leg portions respectively. A plate capacitor, which is arranged between the magnetic cores, has a pair of electrodes. One of the electrodes is electrically connected to the hot lead terminal. A ground lead terminal is arranged between the magnetic cores, to be electrically connected to the other electrode of the capacitor.

In the three terminal filter according to the present invention, the hot lead terminal is thus provided with the substantially U-shaped holding portions, whereby each of the magnetic cores received by the outer leg portions of the holding portions is positioned between both the leg portions of the respective holding portion. Further, the plate capacitor is arranged between the magnetic cores, whereby movement of the plate capacitor is restricted by the magnetic cores.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a plan view of the three terminal filter as shown in FIG. 5;

FIG. 7 is a sectional view taken along the line B—B' in FIG. 6;

FIG. 8 is a front elevational view showing a modification of a hot lead terminal which may be employed in the three terminal filter according to the present invention;

FIG. 9 is a front elevational view of a conventional three terminal filter;

FIG. 10 is an elevational view showing an exemplary mounting arrangement of the conventional three terminal filter; and FIG. 11 is a sectional view showing ferrite beads mounted on a hot lead terminal in the conventional three terminal filter.

DESCRIPTION OF THE PREFERRED EMBODIMENTS

Embodiments of the present invention will now be described in detail with reference to the accompanying drawings.

Figure 1:
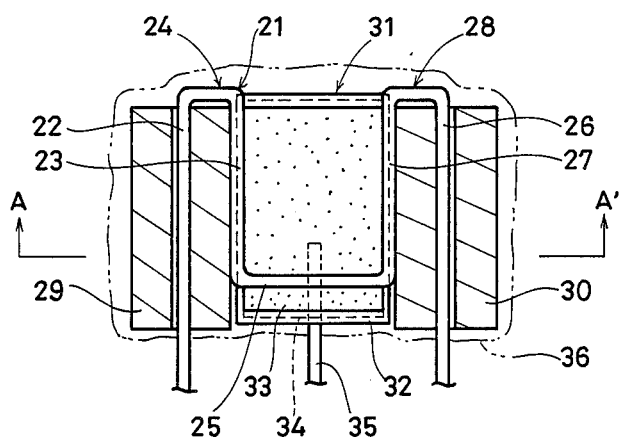
FIG. 1 is a longitudinal sectional view showing a three terminal filter according to a first embodiment of the present invention.

Referring to FIG. 1 showing a first embodiment of the present invention, a hot lead terminal 21 has substantially U-shaped first and second holding portions 24 and 28. The first holding portion 24 has a pair of outer and inner leg portions 22 and 23, respectively. The second holding portion 28 also has a pair of parallel outer and inner leg portions 26 and 27, respectively. The second holding portion 28 is continuous with the first holding portion 24, being connected by a connecting portion 25 with a prescribed space therebetween. Ferrite beads 29 and 30 which serve as magnetic cores, are mounted on respective outer leg portions 22 and 26, to be held between the pairs of leg portions 22, 23 and 26, 27 respectively. The ferrite beads 29 and 30 are thus held between the leg portions 22, 23 and 26, 27, whereby they are reliably positioned. A plate capacitor 31 has a pair of capacitor electrodes 33 and 34 provided on front and rear surfaces of a dielectric substrate 32 which is in the form of a rectangular plate. One electrode 33 of the capacitor 31 is electrically connected with the connecting portion 25 of the hot lead terminal 21 with solder or the like. The capacitor 31 is provided between the ferrite beads 29 and 30 and closely adjacent to the same. Further, the capacitor 31 is arranged to be in contact with the leg portions 23 and 27. Thus, the capacitor 31 can be reliably positioned, while also being arranged within the thickness of the ferrite beads 29 and 30. A ground lead terminal 35 is electrically connected with the other electrode 34 of the capacitor 31 with solder or the like, and is arranged between the leg portions 22 and 26. The ground lead terminal 35 has a portion facing the connecting portion 25, and an end thereof extends outwardly away from the dielectric substrate 32. An armoring member 36 of insulating resin or the like is provided to cover the outer peripheries of the ferrite beads 29 and 30 and the capacitor 31, if necessary.

Figure 3:
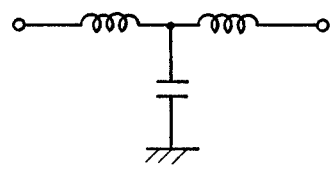
FIG. 3 is an equivalent circuit diagram of a three terminal filter.
Figure 4:
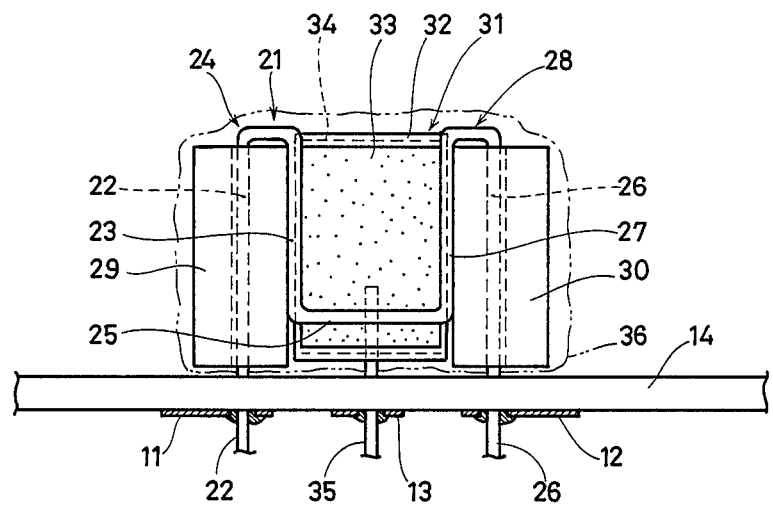
FIG. 4 is an elevational view showing an exemplary mounting arrangement of the three terminal filter according to the first embodiment of the present invention.

The aforementioned three terminal filter according to the first embodiment of the present invention forms an equivalent circuit as shown in FIG. 3. This filter is employed as shown in FIG. 4, for example. Referring to FIG. 4, a printed circuit board 14, which is formed on its rear side with input/output patterns 11 and 12 and a ground pattern 13, is provided with holes (not shown) passing through the respective patterns 11, 12 and 13 from the front side of the printed circuit board 14. These holes are adapted to receive the leg portions 22 and 26 of the hot lead terminal 21 and the ground lead terminal 35. The leg portions 22 and 26 of the hot lead terminal 21 and the ground lead terminal 35 are connected/fixed to the respective patterns 11, 12 and 13 with solder or the like. The bottom surfaces of the ferrite beads 29 and 30 or that of the armoring member 36 is brought into contact with the front surface of the printed circuit board 14. Further, the connecting portion 25 facing the ground lead terminal 35 is provided in the vicinity of the front surface of the printed circuit board 14. Thus, the path through the capacitor 31, i.e., from the hot lead terminal 21 to the ground pattern 13 through the capacitor electrodes 33 and 34 and the ground lead terminal 35, is reduced in length, to prevent generation of unwanted inductance in the capacitor electrode 34 and the ground lead terminal 35.

Figure 2:
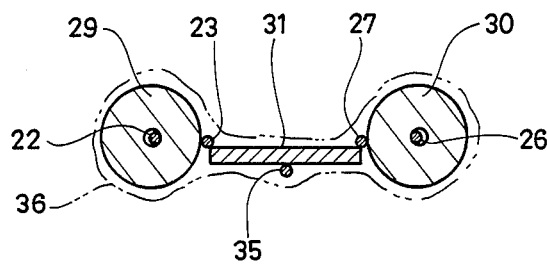
FIG. 2 is a sectional view taken along the line A—A' in FIG. 1.
Figure 5:
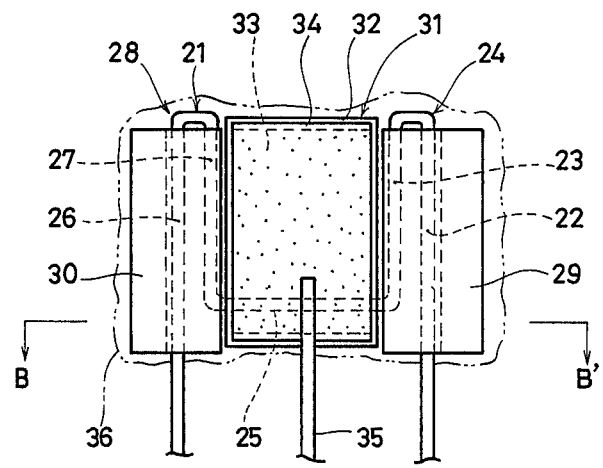
FIG. 5 is a rear elevational view of a three terminal filter according to a second embodiment of the present invention.

FIGS. 5, 6 and 7 show a three terminal filter according to a second embodiment of the present invention. This filter is partly identical in basic structure to the first embodiment as shown in FIGS. 1 and 2. Elements identical to those of the first embodiment are indicated by the same reference numerals, and the following description relates only to different points.

In the second embodiment, head parts of the first and second holding portions 24 and 28 are forward slightly, as shown in FIG. 6, to define a cavity 40 for enclosing the capacitor 31 between the leg portions 22 and 26. The capacitor 31 is arranged in the cavity 40, so that the leg portions 22 and 26 are provided in the same plane with the ground lead terminal 35. In order to decrease the product in thickness to reduce its size, the ferrite beads 29 and 30, the leg portions 22, 23, 26 and 27, the capacitor 31 and the ground lead terminal 35 are preferably all arranged in a space defined by the thickness of the ferrite beads 29 and 30.

The three terminal filter according to the present invention is not restricted to the aforementioned embodiments, but the same can be appropriately modified within the scope of the present invention.

In the hot lead terminal 21 of the first embodiment, for example, the leg portions 22 and 26 may be slightly tapered toward the leg portions 23 and 27 as shown in FIG. 8. Thus, the ferrite beads 29 and 30 can be further reliably held and positioned between the leg portions 22, 23 and 26, 27. The hot lead terminal 21 of the second embodiment can also be modified in a similar manner, as a matter of course.

Further, the plate capacitor 31 may be replaced by that of another configuration, such as a discoidal one.

What is claimed is:

1. A three terminal filter comprising:
   a hot lead terminal defined by a continuous conductor shaped to form a pair of substantially U-shaped first and second holding portions which are interconnected and spaced apart by a connecting portion and thereby held substantially parallel with each other to define therebetween a space, said U-shape of each of said first and second holding portions being defined by a pair of substantially parallel outer and inner leg portions interconnected by a head portion;
   a pair of magnetic cores each mounted on a respective one of said outer leg portions of said holding portions and held between said outer leg portion and the corresponding inner leg portion;
   a plate capacitor arranged between said magnetic cores in said space and having a pair of opposed electrodes, one of said electrodes being electrically connected to said hot lead terminal; and
   a ground lead terminal arranged between said magnetic cores and electrically connected with the other said electrode of said capacitor.

2. A three terminal filter in accordance with claim 1, wherein said plate capacitor is arranged in contact with both said inner leg portions.

3. A three terminal filter in accordance with claim 1, wherein said plate capacitor is located entirely within a space defined by the thickness of said magnetic cores.

4. A three terminal filter in accordance with claim 3, wherein said head portions of said first and second holding portions are bent so that said outer and inner leg portions define respective planes which define a cavity in which said capacitor is arranged.

5. A three terminal filter in accordance with claim 1, wherein said plate capacitor and said magnetic cores are covered by an insulative armoring member.

6. A three terminal filter in accordance with claim 1, wherein said connecting portion is connected to a lower portion of said capacitor, and said ground lead terminal is also connected to said lower portion of said capacitor.

7. A three terminal filter in accordance with claim 1, wherein said pairs of substantially parallel outer and inner leg portions angle slightly toward one another as they extend away from said head portions and toward said connecting portion.

8. A three terminal filter in accordance with claim 1, wherein said capacitor is in the form of a rectangular plate.

9. A three terminal filter comprising:
 a hot lead defined by a continuous conductor shaped to form a pair of substantially U-shaped holding portions; each said holding portion being defined by a respective pair of outer and inner leg portions which are interconnected by a head portion at an upper side of said filter; said outer leg portions extending downward from a lower side of said filter to form a pair of hot terminals for said filter; said inner leg portions being interconnected and spaced apart and held substantially parallel to one another by a connecting portion of said hot lead at said lower side of said filter;
 a pair of magnetic cores each being held between said outer leg portion and the corresponding inner leg portion of a respective one of said holding portions;
 a substantially flat capacitor disposed in a space defined between said magnetic cores and having a pair of opposed electrodes, a first one of which is electrically connected to said hot lead; and
 a ground lead electrically connected to the second one of said electrodes and extending away from said lower side of said filter in said downward direction to form a ground terminal for said filter.

10. A three terminal filter as in claim 9, wherein each said magnetic core has an axial through-hole in which a respective one of said outer leg portions is received.

11. A three terminal filter as in claim 9, wherein said first electrode of said capacitor is electrically connected to said connecting portion of said hot lead at said lower side of said filter.

12. A three terminal filter as in claim 11, wherein said ground lead is electrically connected to said second electrode at said lower side of said filter at a location opposing said connecting portion of said hot lead on the opposite side of said flat capacitor.

13. A three terminal filter as in claim 9, wherein said head portions of said holding portions are bent so that said two inner leg portions define a plane and said two outer leg portions define another plane, said capacitor being disposed between said planes.

14. A three terminal filter as in claim 9, wherein said outer leg portions angle slightly toward said inner leg portions as they extend away from said head portions in said downward direction.

* * * * *